(12) United States Patent
Wang et al.

(10) Patent No.: US 7,751,241 B2
(45) Date of Patent: *Jul. 6, 2010

(54) READ METHOD OF MEMORY DEVICE

(75) Inventors: Jong Hyun Wang, Cheongju-si (KR);
Jun Seop Chung, Seongnam-si (KR);
Seok Jin Joo, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/422,870

(22) Filed: Apr. 13, 2009

(65) Prior Publication Data

US 2009/0201727 A1 Aug. 13, 2009

Related U.S. Application Data

(62) Division of application No. 11/771,963, filed on Jun. 29, 2007, now Pat. No. 7,518,913.

(30) Foreign Application Priority Data

Feb. 22, 2007 (KR) .................... 10-2007-0017927

(51) Int. Cl.
*G11C 11/34* (2006.01)

(52) U.S. Cl. ..................... 365/185.03; 365/185.09; 365/185.24; 365/189.011

(58) Field of Classification Search ............ 365/185.03, 365/185.09, 185.24, 185.11, 189.011
See application file for complete search history.

(56) References Cited

U.S. PATENT DOCUMENTS

| 7,193,898 | B2 | 3/2007 | Cernea |
| 7,518,913 | B2 * | 4/2009 | Wang et al. ............ 365/185.03 |
| 2004/0136220 | A1 | 7/2004 | Cohen |
| 2006/0028875 | A1 | 2/2006 | Avraham et al. |
| 2007/0234183 | A1 | 10/2007 | Hwang et al. |
| 2008/0094927 | A1 | 4/2008 | Kim |

FOREIGN PATENT DOCUMENTS

| JP | 09-139092 A | 5/1997 |
| JP | 2000-182386 | 6/2000 |
| KR | 10-2007-0019575 A | 2/2007 |

* cited by examiner

*Primary Examiner*—Anh Phung
*Assistant Examiner*—Toan Le
(74) *Attorney, Agent, or Firm*—Townsend and Townsend and Crew LLP

(57) ABSTRACT

A read method of a memory device including a MLC includes the steps of performing a data read operation according to a first read command; determining whether error correction of the read data is possible; if, as a result of the determination, error correction is difficult, performing a data read operation according to a second read command; determining whether error correction of read data is possible according to the second read command; and if, as a result of the determination, error correction is difficult, performing a data read operation according to a $N^{th}$ ($N \geq 3$, N is an integer) read command.

11 Claims, 4 Drawing Sheets

READ METHOD OF MEMORY DEVICE

CROSS-REFERENCES TO RELATED APPLICATIONS

The present application claims priority to Korean patent application number 10-2007-017927, filed on Feb. 22, 2007, and is a divisional of application Ser. No. 11/771,963 filed Jun. 29, 2007, now U.S. Pat. No. 7,518,913, issued on Apr. 14, 2009, both of which are incorporated by reference in their entirety.

BACKGROUND OF THE INVENTION

The present invention relates to flash memory devices and, more particularly, to a read method in which cell information can be read more accurately even when a cell threshold voltage has been shifted due to a cell retention characteristic.

A NAND flash memory device includes memory cells whose sources and drains are connected in series to one bit line to form a string. The memory cell generally has a transistor structure in which a floating gate and a control gate are stacked. A memory cell array is directly formed within a N-type well or P-type well formed in a P-type substrate or N-type substrate. The drain side of a NAND cell string is connected to the bit line through a select gate, and the source side is also connected to a source line through a select gate. The control gates of memory cells in adjacent cell stings are consecutively connected in a row direction and become a word line.

An operation of the NAND flash memory device is described below. A data write operation is sequentially performed starting from a memory cell, which is furthermost from the bit line. A control gate of a selected memory cell is applied with a high voltage Vpp, a control gate and a select gate of a memory cell on the bit line side of the selected memory cell are applied with an intermediate potential, and a bit line is applied with 0V or an intermediate potential depending on the data. If the bit line is applied with 0V, a potential is created between the drain and gate of the selected memory cell, so that electrons are injected into the floating gate. Due to this, the threshold voltage of the selected memory cell is increased.

In recent years, in order to further improve the degree of integration of flash memory, much research has been done on a multi-bit cell capable of storing a plurality of data bits in one memory cell. This kind of a memory cell is referred to as a "Multi Level Cell (MLC)". A memory cell of a single bit, corresponding to the MLC, is referred to as a "Single Level Cell (SLC)".

The MLC generally has four or more threshold voltage distributions, and four or more data storage states corresponding to the threshold voltage distributions. The MLC in which 2-bit data bits can be programmed has four data storage states; [11], [10], [00] and [01]. The states correspond to the threshold voltage distributions of the MLC.

For example, assuming that threshold voltage distributions of a memory cell are −2.7V or less, 0.3V to 0.7V, 1.3V to 1.7V, and 2.3V to 2.7V, the state [11] corresponds to −2.7V or less, the state [10] corresponds to 0.3V to 0.7V, the state [00] corresponds to 1.3V to 1.7V, and the state [01] corresponds to 2.3V to 2.7V. In other words, if the threshold voltage of the MLC corresponds to one of the four threshold voltage distributions, 2-bit data information corresponding to one of the states [11], [10], [00] and [01] is stored in the MLC.

As described above, the MLC has threshold voltage distributions corresponding to the square of 2 with respect to the number of bits that can be stored. That is, a MLC capable of storing m bits has $2^m$ cell voltage distributions.

The cell voltage of the cell voltage distributions of the MLC is shifted as the storage period increases. This is called a "data retention characteristic". That is, while data is stored, and then read over a long period of time, the cell voltage is shifted, which may cause a read error.

SUMMARY OF THE INVENTION

Accordingly, the present invention relates to a read method of a memory device, in which the data read operation can be performed more accurately by changing a read voltage in line with a change in the cell voltage depending on the retention characteristic of a MLC.

In an aspect, a read method of a memory device having a MLC includes the steps of performing a data read operation according to a first read command, determining whether error correction of the read data is possible, if, as a result of the determination, error correction is difficult, performing a data read operation according to a second read command, determining whether error correction of read data is possible according to the second read command, and if, as a result of the determination, error correction is difficult, performing a data read operation according to a $N^{th}$ ($N \geq 3$, N is an integer) read command.

In another aspect, a read method of a memory device having a MLC includes the steps of inputting one of a plurality of read commands defined according to priorities, inputting address information of the MLC on which data read will be performed, loading read voltage groups stored with respect to the input read command, and performing the data read using the loaded read voltage groups.

DESCRIPTION OF SPECIFIC EMBODIMENTS

Specific embodiments according to the present patent will be described with reference to the accompanying drawings.

Figure 1A:
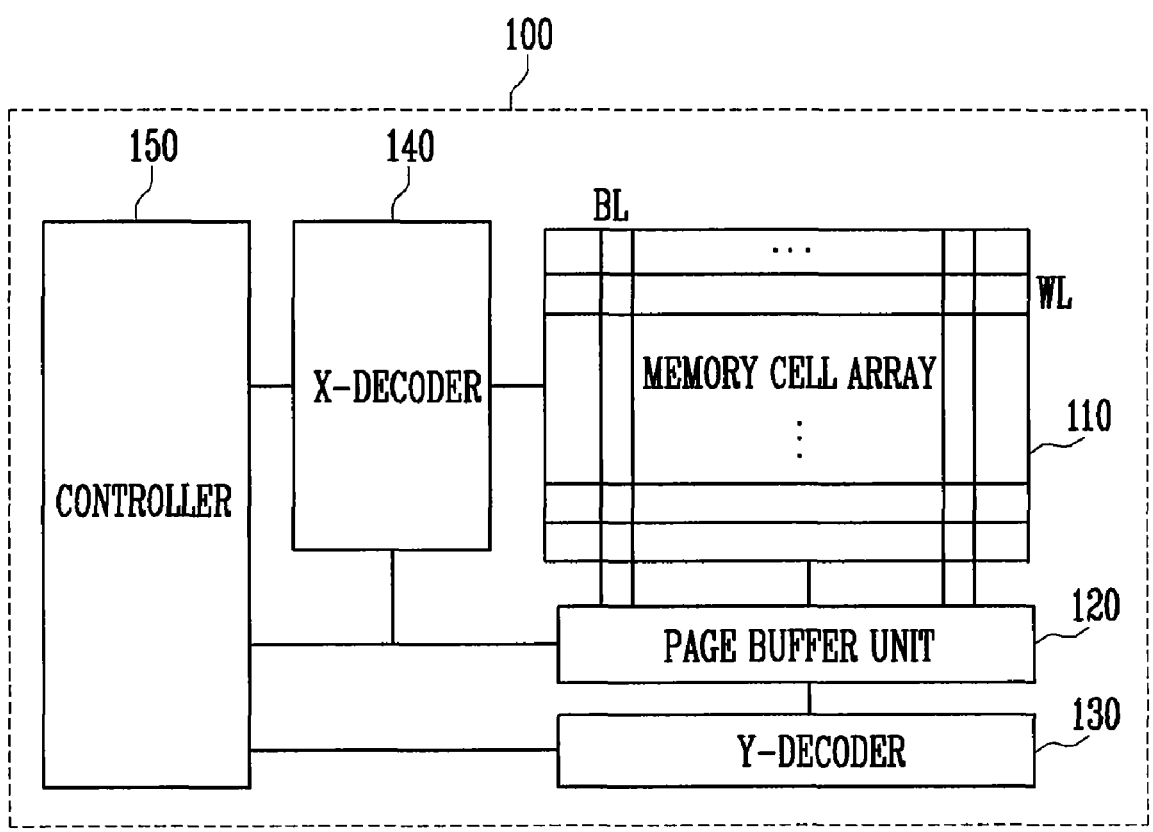
FIG. 1A illustrates the block diagram of the NAND flash memory device.

Referring to FIG. 1a, a flash memory device 100 includes a memory cell array 110, a page buffer unit 120, a x-decoder 140, a Y-decoder 130 and a controller 150.

The memory cell array 110 includes a plurality of memory strings, each of which has a plurality of memory cells and connected to the respective bit lines BL. Each memory cell in row direction is connected to a word line WL.

A program or a read operation is performed by the page buffer unit 120 having a plurality of page buffers.

Each page buffer is coupled to two bit lines and selected by the Y-decoder 130. The word line is selected by X-decoder 140. The X-decoder 140, the Y-decoder 130 and the page buffer unit 120 is controlled by the controller 150.

Figure 1B:
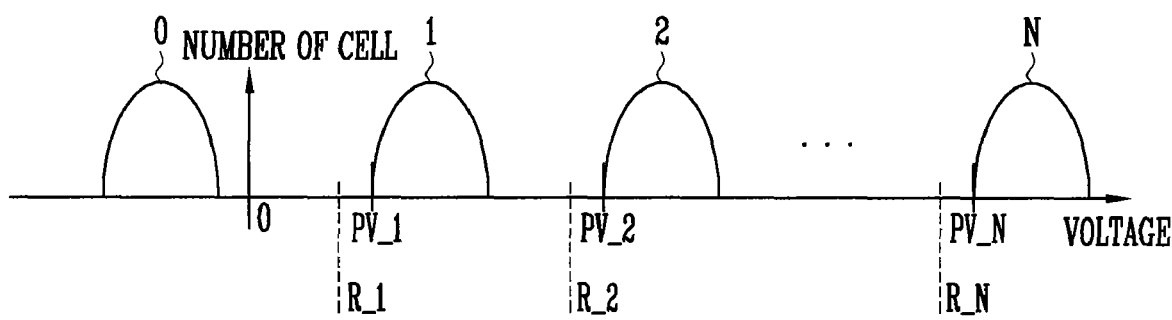
FIG. 1B illustrates the distributions of the cell voltage of a MLC.

Referring to FIG. 1B, a MLC capable of storing a plurality of data bits has N threshold voltage distributions 1, 2, 3, . . . , N.

A threshold voltage distribution of 0V or less indicates the cells in a block are not programmed. Appropriate read voltages needs to be selected to determine whether or not certain cells have been programmed. A first threshold voltage distribution 1 exists between a first verify voltage PV_1 and a second verify voltage PV_2. If a first read voltage R_1 is selected, the cells with the first threshold voltage distribution 1 would be recognized as having been programmed. However, if a second read voltage R_2 is used, the cells would not be recognized as having been programmed.

That is, if a read operation is performed based on the first read voltage R_1, current does not flow through the bit line and the cells would be recognized as having been programmed. On the other hand, if the second read voltage R_2 is applied, current flows through the bit line and the cells would be recognized as having been programmed.

In this manner, each threshold voltage distribution in a MLC is associated with a verify voltage PV and a read voltage R, so that proper determination can be made as to the proper state or level of the cells.

Figure 1C:
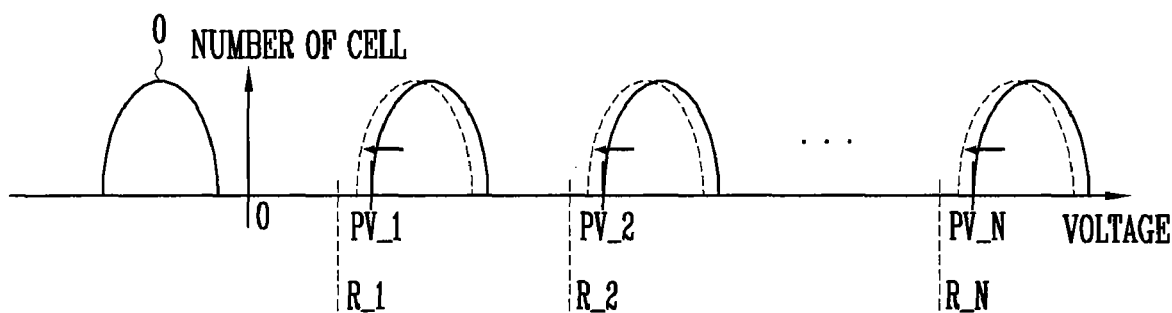
FIG. 1C illustrates the distributions of a change in the cell voltage shown in FIG. 1B.

FIG. 1C illustrates a change or shift in the distributions of the cell voltage shown in FIG. 1B due to a retention characteristic.

Referring to FIG. 1C, it can be seen that the shift of the threshold voltage distributions of FIG. 1B are indicated by dotted lines. If the shift of the threshold voltage distributions is significant, proper reading of the states or levels of the cells using the predefined read voltages R_1 to R_N becomes difficult.

In the present embodiment, the data read operation is performed by changing the voltage of the read operation to compensate for the shift in the threshold voltage.

In other words, a read command is divided into an A read command, a B read command and a C read command, where each read command contains a set of read voltages (an A read voltage group R_1A-R_NA, a B read voltage group R_1B-R_NB and a C read voltage group R_1C-R_NC) which is defined and stored in a controller 150 of a memory device.

In performing a read command, if error correction is difficult, an algorithm for performing the data read operation is performed by changing the read command.

In general, in the case of the MLC flash memory device according to an embodiment of the present invention, an Error Correction Code (ECC) method is used as a method for error correction with respect to read data. The ECC method is a method of performing error correction when error having a predetermined number or fewer occurs. If error having a predetermined number or more occurs, the error correction is difficult to do.

In the present embodiment, if error correction is difficult to do using the ECC method due to errors larger than a predetermined number, the read voltage groups is changed and then read is performed, so that the data read operation can be performed accurately. That is, the read voltage is performed after compensating for the shift in the voltage distribution.

Figure 1D:
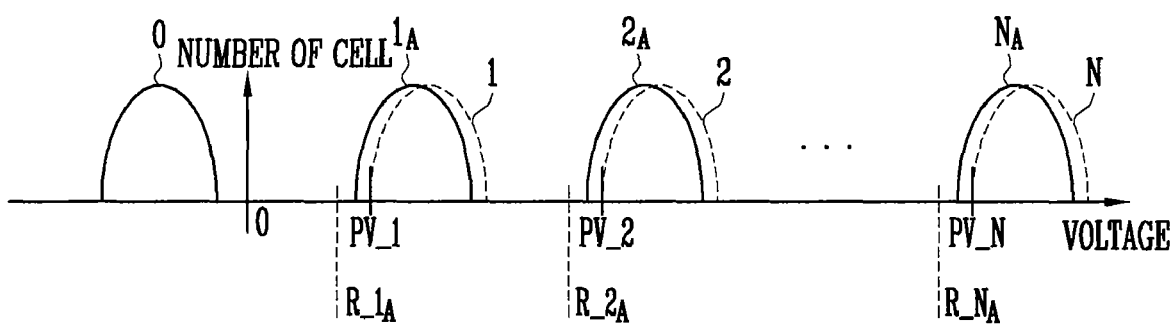
FIG. 1D illustrates the distributions of the cell voltage and the read voltage of a MLC according to a first embodiment of the present invention.

FIG. 1D illustrates the distributions of the cell voltage and the read voltage of a MLC according to a first embodiment of the present invention.

The initial threshold voltage distributions of MLCs, as illustrated in FIG. 1B, have shifted after a first period of time after the data have been programmed. That is, the threshold voltage distributions 1 to N are moved as A threshold voltage distributions $1_A \ldots N_A$. The dotted lines indicate the initial voltage distributions.

In the A threshold voltage distributions $1_A \ldots N_A$, a read operation is performed based on A read voltage group $R_{1A} \ldots R_{NA}$. In the A read voltage group, the read operation is performed in response to the A read command. The read operation of the MLC flash memory device is well known in the art and will not be described in detail for simplicity. In this case, the A read voltage group $R_{1A} \ldots R_{NA}$ are used as a read voltage set for the read operation.

Figure 1E:
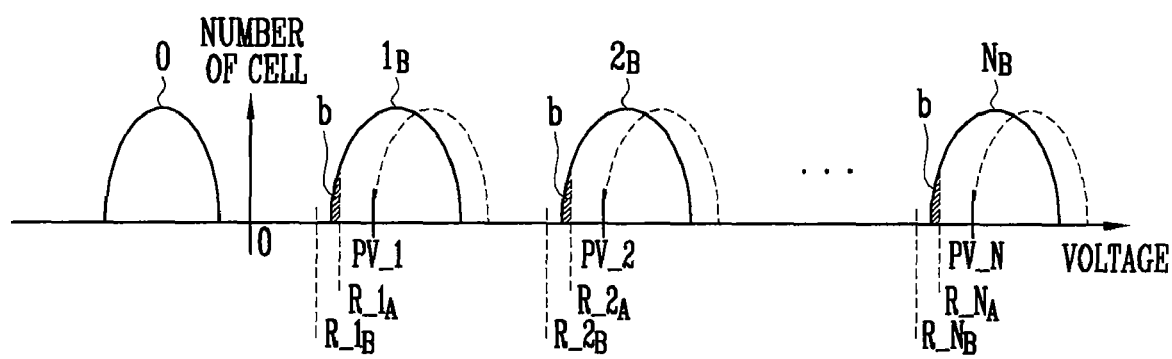
FIG. 1E illustrates the distributions of the cell voltage and the read voltage of a MLC according to a second embodiment of the present invention.

FIG. 1E illustrates the distributions of the cell voltage and the read voltage of a MLC according to a second embodiment of the present invention.

FIG. 1E illustrates threshold voltage distributions after a second period of time after the data have been programmed. The second period of time is after the first period of time. From FIG. 1E, it can be seen that the initial voltage distributions have shifted to B threshold voltage distributions $1_B \ldots N_B$. Furthermore, as illustrated in FIG. 1E, in the B threshold voltage distributions $1_B \ldots N_B$, read errors occur in regions b of the threshold voltage distributions in the case where a read operation is performed based on the A read voltage group $R_{1A} \ldots R_{NA}$. In this case, when there are many cells distributed in the regions b, it is difficult to perform error correction using the ECC method. Accordingly, a read operation is performed using the B read voltage group $R_{1B} \ldots R_{NB}$ in FIG. 1E. The B read voltage group $R_{1B} \ldots R_{NB}$ have read voltages lower than those of the A read voltage group $R_{1A} \ldots R_{NA}$ to compensate for the greater shift in the voltage distributions. The read operation is performed using the B read voltage group by inputting or initiating the B read command.

Figure 1F:
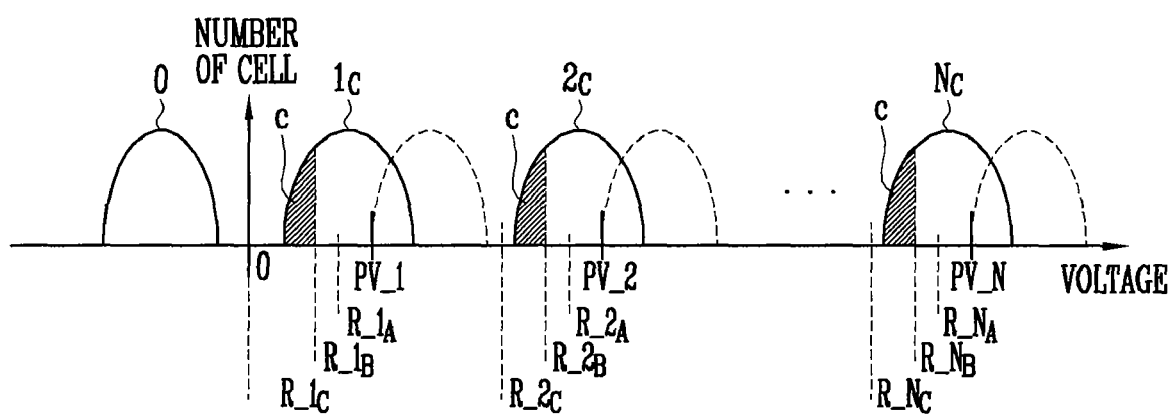
FIG. 1F illustrates the distributions of the cell voltage and the read voltage of a MLC according to a third embodiment of the present invention.

FIG. 1F illustrates the distributions of the cell voltage and the read voltage of a MLC according to a third embodiment of the present invention.

FIG. 1F illustrates threshold voltage distributions after a third period of time after the programming. The third period of time is longer than the second period of time. The initial voltage distributions have shifted by a greater amount than after the second period of time. Furthermore, as illustrated in FIG. 1F, with the C threshold voltage distributions $1_C \ldots N_C$, read errors occur in regions c of the threshold voltage distributions if a read operation is performed based on the B read voltage group $R_{1B} \ldots R_{NB}$. In this case, when there are many cells distributed in the regions c, it is difficult to perform error correction using the ECC method. Accordingly, a read operation is performed on C using read voltage group $R_{1C} \ldots R_{NC}$. In this case, the C read voltage group $R_{1C} \ldots R_{NC}$ have read voltages lower than those of the B read voltage group $R_{1B} \ldots R_{NB}$. In addition, in order to perform the read operation using the C read voltage group, the C read command is input.

In this embodiment of the present invention the controller performs the read operation by changing the command from the A read command to the B read command and then to the C read command. The controller selects the appropriate read command based on the number of errors received using the ECC method, i.e., when the ECC method is difficult to perform. In another embodiment, the controller may select an appropriate read command (A, B, or C) using methods other than the ECC method.

The read voltage information regarding the read voltage groups A to C with respect to the A to C read commands can be previously set according to characteristics of a MLC flash memory device and be stored in related to the execution of an operation command of the controller 150. The read command groups stored in memory can be modified by a program. Accordingly, the read command groups may be set by modifying an algorithm rather than changing the hardware components.

Figure 2:
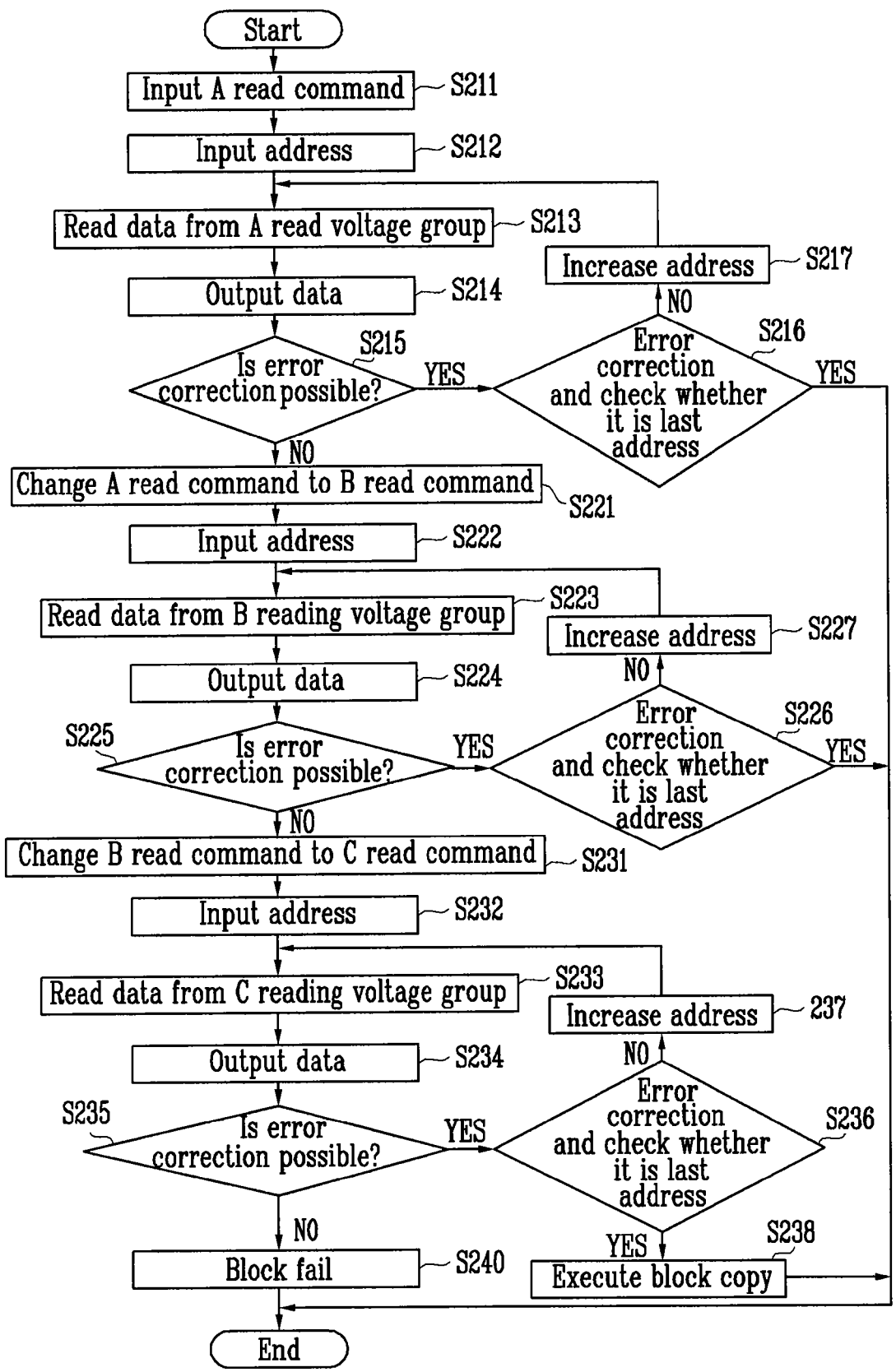
FIG. 2 is a flowchart illustrating a read method of the MLC according to an embodiment of the present invention.

FIG. 2 is a flowchart illustrating a read method of the MLC according to an embodiment of the present invention.

Referring to FIG. 2, in the read method of the MLC according to an embodiment of the present invention, an A read command is input to the controller 150 in step S211, and then a read address is input to the controller 150 in step S212.

In one implementation, a general read command is input and the controller is configured to execute predefined sets of commands, starting with the A read command. Alternatively, a specific command, e.g., A read command, the B read command or the C read command, can be input, so that the controller would start with the specified command.

In performing the read operation starting from the input address, the controller can perform the read operation using the A read voltage group $R_{1_A} \ldots R_{N_A}$ in step S213. Read data is output from the controller in step S214. The output data having an error is corrected through the ECC method. In the present implementation, the ECC method can be performed to correct the error if the error rate is 10% or less. If the error rate is greater than 10% of the data being evaluated, then the error correction is difficult to perform using the ECC method.

At step S215, the controller determines whether a correction in step S215 is possible. In the present embodiment, the error rate is determined by counting the cells with an error. This may be done by the controller. If the cells having errors exceeds a predetermined number (e.g., 10 percent of the number of cells being evaluated), then the controller determines that the error correction method cannot be performed effectively.

If effective error correction is determined to be possible, error correction is made if needed and the controller determines whether the address of the page being considered is the last address of a block (step S216). If the address is not the address of the last page, the controller increases the address in step S217 and performs a data read operation in step S213 and then outputs data in step S214.

On the other hand, the read operation is completed if the controller determines that the page processed has the last address of the block.

At step S215, it is determined that effective error correction is difficult to obtain (e.g., error rate of 10% or more has occurred), the read command is changed to the B read command from the A read command (step S221). In this case, a threshold voltage shift has exceeded the error correction range (see FIG. 1E). An address of a page is inputted in response to the B read command (step S222). The controller performs a read operation according to the B read voltage group $R_{1_B} \ldots R_{N_B}$ (step S223) and outputs data (step S224).

In the one implementation (or first method), the address input at step S222 is the address of a page whose error correction was difficult at step S215. In other words, the controller is configured to store addresses of the pages for which the error correction were difficult to perform while executing the A read command. For example, of 32 pages read, if the first and third pages had too high error rates and the error correction could not be effectively performed, then the controller would temporarily store the addresses of the first and third pages and read the first and third pages using the B read command at step S223.

In another implementation (or second method), if error correction with respect to a specific page is difficult while the read operation is performed on a page basis, the controller can perform a read operation on the pages of the remaining blocks sequentially by using the B read voltage group $R_{1_B} \ldots R_{N_B}$ starting from the address of a corresponding page after changing the read command to the B read command.

Generally, the second method rather than the first method is used. Thus, the address input in step S222 is an address of a page whose error correction has been determined to be difficult as a result of the reading according to the A read command. A subsequent data read operation is performed according to the B read command.

If read data is output according to the B read command, the controller determines whether error correction is possible (step S225). If effective error correction is deemed possible, an error correction is performed if needed. The controller determines whether the address processed is the address of the last page (step S226). If not, the address is incremented to read the next page (step S227).

On the other hand, if effective error correction is deemed to be difficult to perform on the data read according to the B read command, the command is changed to the C read command (step S231). Addresses of the pages to be read using the C read command are input (step S232). These addresses correspond to the addresses input at step S222.

Data are read using on the C read voltage group $R_{1_C} \ldots R_{N_C}$ (step S233). The data read are n output in step S234. It is then determined whether effective error correction is possible with respect to the data outputted (step S235). If effective error correction is possible, the error correction is made, if needed. A determination is made 20 whether or not the address processed is the address of the last page (step S236). If the address is not the address of the last page, the address is incremented and data are read using the C read command.

At step S236, the address is the address of the last page, a block copy with respect to a corresponding memory block is performed (step S238). Thereafter, the read operation is completed. The block copy is performed to move the data to another memory block to preserve the data in order to prevent the data from changing since the recovery of the data is impossible if the threshold voltage of a cell is changed due to further retention after reading is performed according to the C read command.

If effective error correction is difficult even after executing the C read command, a block fail process is issued for the block (step S240). The blocks with a block-failed indication are generally not used for storing data. Such blocks may, however, be used after a global erase operation.

If error rate is determined to exceed a given level, e.g., 10 percent, a read command may be selected from a set of read commands. Each read commands uses a set of read voltages that has lower voltages than the initial read voltages to compensate for the threshold voltage shift over time. In the present embodiment, the A read command, the B read command, and the C read command use the read voltages that progressively have lower read voltages.

Furthermore, according to an embodiment of the present invention, by setting the read voltage groups with respect to the respective read commands by dividing them into the first read command to a $M^{th}$ ($M \geq 2$, M is an integer) read command, the data read operation can be performed accurately through the M-time read operation. After the $M^{th}$ read command is executed, a memory block copy is executed, so that the error that may happen subsequently can be reduced.

Furthermore, as mentioned above, the read voltage groups depending on the respective read commands are stored in the controller and an algorithm for the read operation method depending on the operating sequence according to FIG. 2 is stored in the controller.

As described above, in accordance with the read method of a memory device according to the present invention, after cell threshold voltages are changed due to a retention characteristic, read voltages are also changed. It is therefore possible to perform an accurate data read operation.

Although the foregoing description has been made with reference to the specific embodiments, it is to be understood that changes and modifications of the present patent may be made by the ordinary skilled in the art without departing from the spirit and scope of the present patent and appended claims.

What is claimed is:

1. A read method of a memory device including Multi-Level Cells (MLCs), the method comprising:
    performing a first read operation of memory cells using first read voltages; and
    performing a second read operation of the memory cells using second read voltages in case a first error rate of a data outputted from the memory cells by the first read operation exceeds a first level.

2. The read method of claim 1, wherein the first and second read voltages each include at least three different voltages that are used to read at least three different programmed states of the MLCs.

3. The read method of claim 2, wherein the three different voltages of the second read voltages are respectively lower than the three different voltages of the first read voltages.

4. The read method of claim 1, further comprising performing a first error correction operation of the data using an Error Correction Code (ECC) method in case the first error rate of the data does not exceed the first level.

5. The read method of claim 1, wherein the first error rate is deemed to have exceeded the first level if the first error rate is determined to be at least 10 percent of data processed.

6. The read method of claim 1, further comprising performing a third read operation of the memory cells using third read voltages in case a second error rate of a data outputted from the memory cells by the second read operation exceeds a second level.

7. The read method of claim 6, wherein the third read voltages include at least three different voltages that are used to read at least three different programmed states of the MLCs, the three different voltages of the third read voltages are respectively lower than three different voltages used as the second read voltages in the second read operation.

8. The read method of claim 6, wherein the second error rate is deemed to have exceeded the second level if the second error rate is determined to be at least 10 percent of data processed.

9. The read method of claim 6, further comprising performing a second error correction operation of the data using an Error Correction Code (ECC) method in case the second error rate of the data does not exceed the second level.

10. The read method of claim 9, further comprising:
    performing a block copy operation to copy data stored in a memory block including the memory cells to another memory block after performing read operations on all pages in the memory block in case the second error correction operation is performed.

11. The read method of claim 9, further comprising:
    indicating a memory block including the memory cells to be a fail block in case it is impossible to recover the data by the second error correction operation after performing the third read operation.

* * * * *